United States Patent
Hu (10) Patent No.: US 12,101,885 B2
(45) Date of Patent: Sep. 24, 2024

(54) SERVER MOTHERBOARD, SERVER, AND POWER SUPPLY CONTROL METHOD

(71) Applicant: Lenovo (Beijing) Limited, Beijing (CN)

(72) Inventor: Yongbin Hu, Beijing (CN)

(73) Assignee: LENOVO (BEIJING) LIMITED, Beijing (CN)

( * ) Notice: Subject to any disclaimer, the term of this patent is extended or adjusted under 35 U.S.C. 154(b) by 425 days.

(21) Appl. No.: 17/474,053

(22) Filed: Sep. 14, 2021

(65) Prior Publication Data
US 2022/0091647 A1   Mar. 24, 2022

(30) Foreign Application Priority Data
Sep. 18, 2020   (CN) .......................... 202010987091.8

(51) Int. Cl.
*G06F 30/392* (2020.01)
*H05K 1/16* (2006.01)

(52) U.S. Cl.
CPC .................................... *H05K 1/167* (2013.01)

(58) Field of Classification Search
CPC ............... G06F 13/107; G06F 13/4282; G06F 18/211; G06F 18/214; G06F 18/40; G06F 21/56; G06F 21/82; G06F 2213/0008; G06F 2213/0024; G06F 2213/0028; G06F 2213/0032; G06F 2213/0036; G06F 2213/0042; G06F 9/45504; G06F 13/1694; G06F 3/04847; G06F 3/16; G06F 3/167; G06F 1/182; G06F 1/28; G06F 1/3206; G06F 16/2379; G06F 21/32; G06F 2113/10; G06F 2203/0381; G06F 2218/02; G06F 2218/10; G06F 3/011; G06F 3/017; G06F 3/0482; G06F 3/0488; G06F 3/04883; G06F 3/04886; G06F 3/165; G06F 30/17; G06F 30/20; G06F 30/23; G06F 30/25; G06F 3/04815; G06N 3/08; G06N 3/04; H01L 27/1214; H01L 29/16; H01L 21/8252;
(Continued)

(56) References Cited

U.S. PATENT DOCUMENTS

| 2017/0194579 | A1* | 7/2017 | Wang ..................... H10K 71/50 |
| 2019/0148462 | A1* | 5/2019 | Tanaka .................. H10K 50/868 |
| | | | 345/76 |
| 2019/0363264 | A1* | 11/2019 | Kishimoto ............. H05B 33/02 |

FOREIGN PATENT DOCUMENTS

| CN | 204291556 U | 4/2015 |
| CN | 210957883 U | 7/2020 |
| CN | 211427303 U | 9/2020 |

* cited by examiner

*Primary Examiner* — Binh C Tat
(74) *Attorney, Agent, or Firm* — ANOVA LAW GROUP, PLLC (57) ABSTRACT

A server motherboard includes a protective film, a substrate, and a power supply circuit. An equivalent electrical parameter of the protective film changes as a shape of the protective film changes. The shape changes when a temperature of the server mother board is greater than a predetermined temperature. A portion of at least one side surface of the substrate is covered by the protective film. The power supply circuit is electrically connected to the protective film and configured to detect the equivalent electrical parameter of the protective film. The power supply circuit stops outputting a power supply voltage to the substrate when a change of the equivalent electrical parameter is detected.

17 Claims, 3 Drawing Sheets

```
Detect the equivalent electrical parameter of the protective film in the    101
server motherboard, the equivalent electrical parameter of the
protective film changing as the shape of the protective film changes,
and the shape of the protective film changing when the temperature
of the server motherboard is greater than the predetermined
temperature
                              ↓
When the change of the equivalent electrical parameter of the              102
protective film is detected, stop outputting the power supply voltage
to the substrate
```

(58) Field of Classification Search
CPC ..... H01L 21/823418; H01L 21/823807; H01L 2224/05686; H01L 29/4175; H01L 29/24; H05K 7/20181; H05K 7/20745; H05K 1/167
USPC .................................. 716/106–115, 110–120
See application file for complete search history.

| Detect the equivalent electrical parameter of the protective film in the server motherboard, the equivalent electrical parameter of the protective film changing as the shape of the protective film changes, and the shape of the protective film changing when the temperature of the server motherboard is greater than the predetermined temperature | 101 |

| When the change of the equivalent electrical parameter of the protective film is detected, stop outputting the power supply voltage to the substrate | 102 |

FIG. 5

SERVER MOTHERBOARD, SERVER, AND POWER SUPPLY CONTROL METHOD

CROSS-REFERENCE TO RELATED APPLICATION

This application claims priority to Chinese Patent Application No. 202010987091.8, filed on Sep. 18, 2020, the entire content of which is incorporated herein by reference.

TECHNICAL FIELD

The present disclosure generally relates to the power supply control technology field and, more particularly, to a server motherboard, a server, and a power supply control method.

BACKGROUND

Abnormal situations, such as a short circuit, can occur during an operation of a server motherboard. These abnormal situations will cause a current in the server motherboard to increase sharply to a high value. The server motherboard will generate heat because of the high current flowing through. When the temperature in the server motherboard reaches a certain temperature (such as 300 degrees), the substrate (PCB) of the server motherboard will burn, which causes a failure of the server.

SUMMARY

Embodiments of the present disclosure provide a server motherboard including a protective film, a substrate, and a power supply circuit. An equivalent electrical parameter of the protective film changes as a shape of the protective film changes. The shape changes when a temperature of the server mother board is greater than a predetermined temperature. A portion of at least one side surface of the substrate is covered by the protective film. The power supply circuit is electrically connected to the protective film and configured to detect the equivalent electrical parameter of the protective film. The power supply circuit stops outputting a power supply voltage to the substrate when a change of the equivalent electrical parameter is detected.

Embodiments of the present disclosure provide a server including a server motherboard and a communication interface. The server motherboard includes a protective film, a substrate, and a power supply circuit. An equivalent electrical parameter of the protective film changes as a shape of the protective film changes. The shape changes when a temperature of the server mother board is greater than a predetermined temperature. A portion of at least one side surface of the substrate is covered by the protective film. The power supply circuit is electrically connected to the protective film and configured to detect the equivalent electrical parameter of the protective film. The power supply circuit stops outputting a power supply voltage to the substrate when a change of the equivalent electrical parameter is detected. The communication interface is arranged on the server motherboard.

Embodiments of the present disclosure provide a power supply control method. The method includes detecting an equivalent electrical parameter of a protective film in a server motherboard and when a change of the equivalent electrical parameter is detected, stopping a power supply circuit of the server motherboard from outputting a power supply voltage to the substrate. The equivalent electrical parameter changes as a shape of the protective film changes. The shape changes when a temperature of the server motherboard is greater than a predetermined temperature. The protective film covers a portion of at least one side surface of a substrate of the server motherboard.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION OF THE EMBODIMENTS

In many scenarios, abnormal situations such as a short circuit occur during an operation of a server motherboard. These abnormal situations will cause a current in the server motherboard to increase sharply and reach a high value. Because of the high current flowing through, the server motherboard generates heat. When the temperature in the server motherboard reaches a certain temperature (such as 300 degrees), the substrate (PCB) of the server motherboard would burn. Thus, modules arranged at the PCB may be damaged. A protection area may be arranged on the substrate of the server motherboard. The protection area may include a fuse. The protection area may be prevented from burning through the power-off protection of the fuse. However, the method of arranging the fuse in the protection area may only prevent the protection area from burning to protect the protection area and the module arranged in the protection area. If a fuse is arranged at each position of the PCB, the power supply of the fuse and the location of the fuse may need to be carefully designed. Arranging a fuse at each position of the PCB may also increase the cost. Thus, embodiments of the present disclosure provide a server motherboard. At least one side of the PCB of the server motherboard may be covered with a protective film. By monitoring the equivalent electrical parameter of the protective film, the PCB and the modules arranged on the PCB may be protected.

To make the purpose, technical solutions, and advantages of embodiments of the present disclosure clearer, the technical solutions of embodiments of the present disclosure are described in detail in connection with the accompanying drawings of embodiments of the present disclosure. Described embodiments are merely some embodiments of the present disclosure, not all embodiments. Based on embodiments of the present disclosure, all other embodiments obtained by those of ordinary skill in the art without creative effort are within the scope of the present disclosure.

Figure 1:
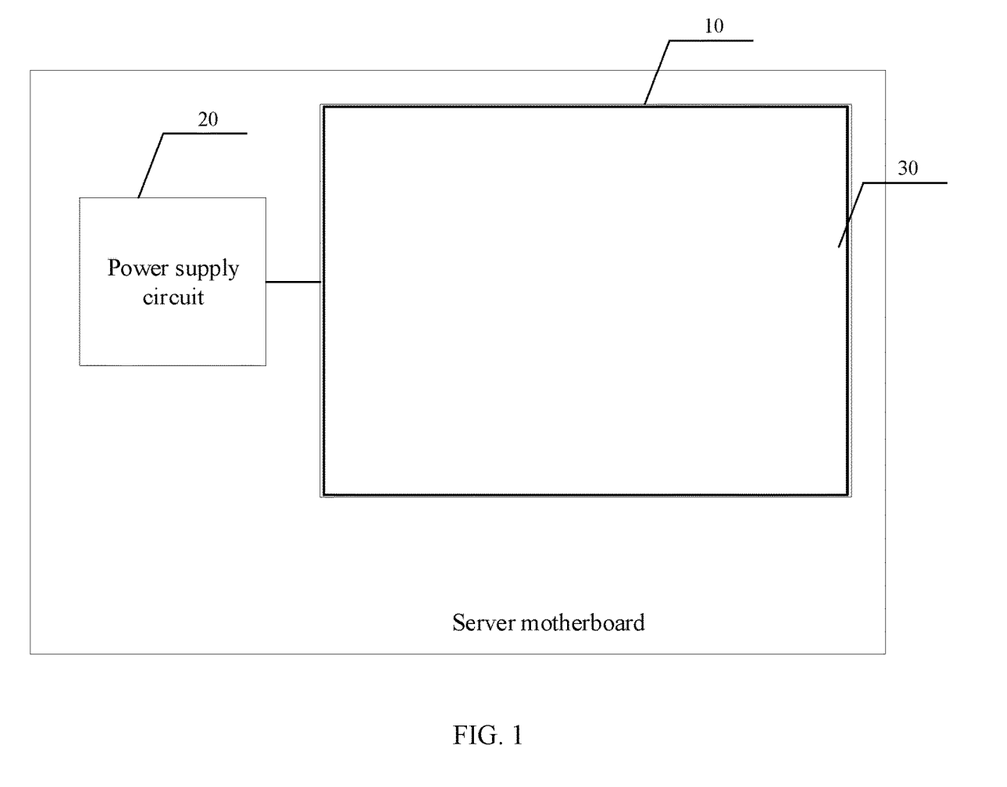
FIG. 1 illustrates a schematic structural diagram of a server motherboard according to some embodiments of the present disclosure.
Figure 2:
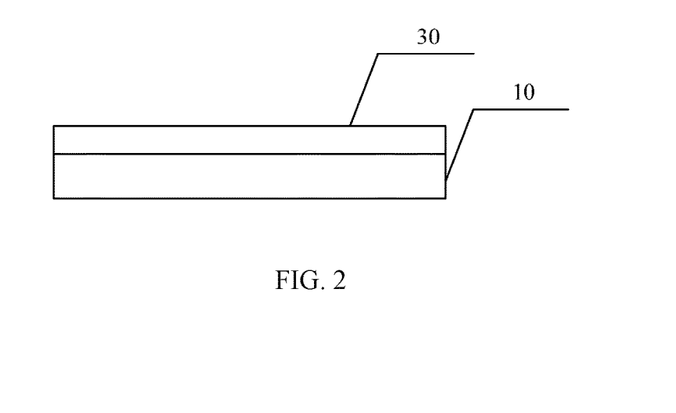
FIG. 2 illustrates a schematic diagram showing a left view of the server motherboard according to some other embodiments of the present disclosure.

With reference to FIG. 1 and FIG. 2, embodiments of the present disclosure provide a server motherboard, which includes a PCB 10, a power supply circuit 20, and a protective film 30. At least one side surface of the PCB 10 is covered with the protective film 30. An equivalent electrical parameter of the protective film may change as a shape of the protective film 30 changes. The shape of the protective film 30 may change when the temperature of the server motherboard is greater than a predetermined temperature.

A portion of the at least the side surface of the PCB 10 being covered with a protective film 30 may include, but is not limited to, at least one of a part of or the whole the surface of the substrate 10 being covered with the protective film, or a portion of each side surface of the PCB 10 being covered with a protective film. For example, as shown in FIG. 1, the shape of the covered protective film 30 is consistent with the shape of the surface of the PCB 10, such that the protective film 30 may cover the whole surface of the PCB 10.

The shape of the protective film 30 being consistent with the shape of the surface of the PCB 10 may include but not limited to as below. The size of the protective film 30 may be consistent with the size of the surface covered by the protective film 30. The PCB 10 may include two surfaces, e.g., a first surface (a front surface) and a second surface (a back surface) opposite to the first surface. The protective film 30 may be arranged on the first surface and the second surface simultaneously. The shape of the protective film 30 arranged on the first surface may be consistent with the shape of the first surface. The shape of the protective film 30 arranged on the second surface may be consistent with the shape of the second surface. The protective film 30 may be further arranged on at least one of the first surface and the second surface.

Since various modules are arranged on the PCB 10, the modules may include modules with different functions composed of at least one device. Thus, at least one of the first surface and the second surface of the PCB 10 may include a plurality of devices. Therefore, at least one of the first surface and second surface of the PCB 10 may not be a flat surface. In covering the surface of the PCB 10 with the protective film 30, the protective film 30 may be cut accordingly, such that the protective film 30 may pass through the devices to be attached to the surface of the PCB 10, or the protective film 30 may cover at least one surface of the PCB and a surface formed by a module arranged on the surface, that is, the protective film 30 may cover a blank area on the one surface of the PCB and the module of the one surface. Thus, the protective film 30 may not be a flat surface, but a thin film with a fluctuating surface. The protective film 30 may also cover a blank area or a portion of the blank area of a surface of the PCB.

In a process of arranging the modules on the PCB 10, a core device may be arranged on a same surface of the PCB 10. For example, the core device such as a heat dissipator, a central processing unit (CPU), and a memory may be arranged on the same surface. These core devices may need to be maintained and replaced. If the protective film 30 is covered on the surface where the core devices are arranged, the maintenance and replacement of the core devices may be affected. Therefore, in some embodiments, the protective film 30 may be arranged on a surface that do not include the core devices. In addition, the core devices may cause a flatness measure of the surface where the core devices are arranged to be smaller than a flatness measure of a surface that does not include the core devices, which affects the adhesion of the protective film 30. Thus, in some embodiments, the protective film 30 may be arranged on the surface that does not include the core devices. For example, if the flatness measure of the first surface is smaller than the flatness measure of the second surface, the second surface may be covered with the protective film 30. The power supply circuit 20 may be arranged on the first surface or the second surface.

The shape of the protective film 30 may change when the temperature of the server motherboard is greater than the predetermined temperature, that is, the shape of the protective film 30 may be changeable. As the temperature of the server motherboard rises, especially to exceed the predetermined temperature, the shape of the protective film 30 may be caused to change under an effect of a high temperature. The temperature of the server motherboard may be represented by the temperature of the PCB. The temperature of the PCB may change with the operation of the module on the PCB, especially the temperature of the PCB may be caused to rise when the number of the modules on the PCB increases and the operation time of the module increases. When the temperature of the PCB rises above the predetermined temperature, the shape of the protective film 30 may begin to change, and the shape may continue to change as the temperature of the PCB rises.

The shape of the protective film 30 may change to a certain degree with the temperature of the server motherboard, which means that the protective film 30 may have a deformation characteristic. Thus, the material of the protective film 30 may include a special material with the deformation characteristic. The special material may deform when the temperature is greater than the predetermined temperature. The special material may include plastic (i.e., high molecular polymer), for example, polyethylene terephthalate (melting point 250-255° C.) or polypropylene (melting point 100° C.). In practical applications, different materials may have different melting points. Thus, the corresponding special material may be selected according to the predetermined temperature. For example, if the predetermined temperature is 300° C., the selected special material may include a material with a melting point at around 300° C. Therefore, the shape of the protective film 30 formed by the special material may change when the temperature of the server motherboard is greater than 300° C.

When the shape of the protective film 30 changes under the situation that the temperature of the server motherboard is greater than the predetermined temperature, the equivalent electrical parameter of the protective film may also change as the shape of the protective film 30 changes. That is, the protective film 30 is not only a thin film covering at least one surface of the PCB 10 to protect the PCB. The protective film 30 may also have a conductive function. Thus, the electrical parameter may be detected from the protective film 30. The protective film 30 covering the PCB 10 may have an initial electrical parameter, which may change with the deformation of the protective film 30.

For example, the protective film 30 covering at least one side surface of the PCB may be equivalent to a resistor or a capacitor. When a current flows through the resistor or the capacitor, a voltage difference may be formed between two ends. Thus, a voltage may be detected from the resistor or the capacitor. After the protective film 30 is prepared, the protective film 30 may need to be cut according to the surface of the PCB. During a cutting process, the initial electrical parameter of the protective film 30 may change. For example, when the protective film 30 is equivalent to a capacitor, if the protective film 30 is cut, the initial capacitance value may change greatly. In this case, the initial capacitance value of the protective film 30 may need to be re-measured, and the capacitor may include a positive electrode and a negative electrode. During a connection process, the positive electrode needs to be connected to the positive electrode, and the negative electrode needs to be connected the negative electrode. Otherwise, an error may occur during the detection. If the protective film 30 is equivalent to a resistor, a change of an initial resistance may be neglected when the protective film 30 is cut. The initial resistance may not need to be re-measured. The resistor that does not have polarity may be connected freely. Therefore, the protective film 30 of embodiments of the present disclosure may include a protective film equivalent to a resistor, such as a variable resistance film. Variable may refer to that the resistance may change as the shape of the variable resistance film changes. In practical applications, the initial resistance of the protective film 30 may also be re-measured to improve detection accuracy.

The power supply circuit 20 and the protective film 30 may be electrically connected and configured to detect the equivalent electrical parameter of the protective film. When the change of the equivalent electrical parameter of the protective film is detected, the power supply voltage may be stopped to output to the PCB 10 to perform power-off protection for the PCB 10. The modules arranged on the PCB 10 may also stop working.

In embodiments of the present disclosure, the equivalent electrical parameter of the protective film may change as the shape of the protective film changes. The shape of the protective film 30 may change when the temperature of the server motherboard is greater than the predetermined temperature, which means that the equivalent electrical parameter of the protective film may change when the temperature of the server motherboard is greater than the predetermined temperature. At this time, the power supply circuit 20 may detect this change and stop outputting the power supply voltage to the PCB 10. In addition, the power supply circuit 20 may also stop outputting the power supply voltage to the PCB 10 when the equivalent electrical parameter of the protective film changes and the equivalent electrical parameter changes to predetermined electrical parameters. In some other embodiments, when the power supply circuit 20 detects the change of the equivalent electrical parameter of the protective film, an instruction signal may be transmitted to the module such as the processor of the PCB 10 to instruct the module such as the processor to stop working to prevent data loss and damage to the modules due to sudden power failure. The values of the predetermined temperature and predetermined electrical parameter are not limited by embodiments of the present disclosure.

Figure 3:
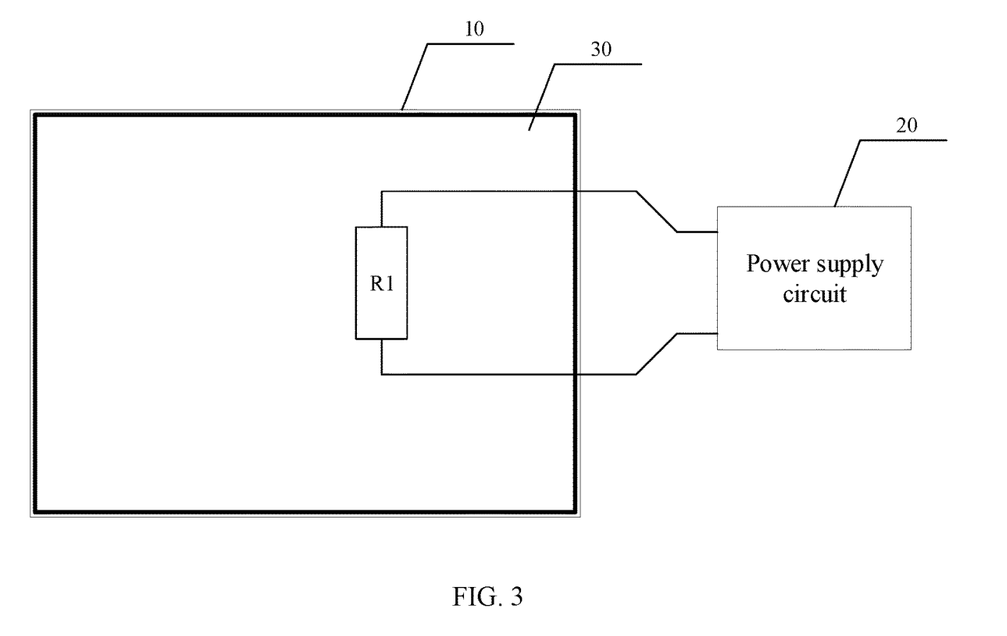
FIG. 3 illustrates a schematic diagram showing an equivalent electrical parameter of a protective film according to some other embodiments of the present disclosure.
Figure 4:
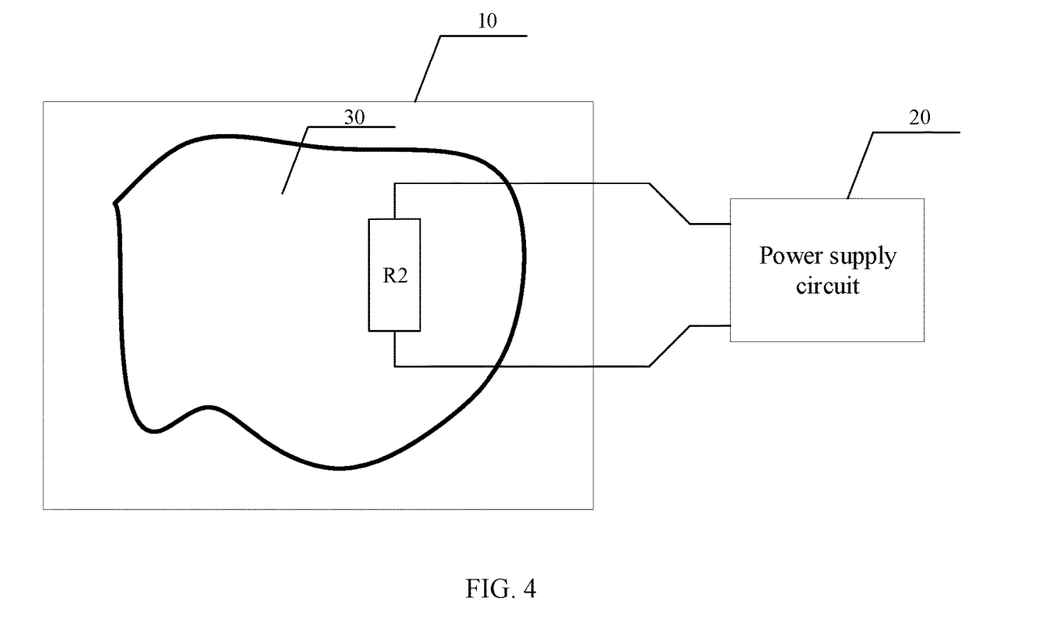
FIG. 4 illustrates a schematic diagram showing a change of an equivalent electrical parameter of a protective film according to some other embodiments of the present disclosure.

The electrical connection between the power supply circuit 20 and the protective film 30 may include arranging two electrodes on the protective film 30. The two electrodes may be connected to the power supply circuit 20. Thus, the power supply circuit may detect the equivalent electrical parameter of the protective film through the two electrodes. As shown in FIGS. 3 and 4, the surface of the PCB without the core devices is covered with the protective film 30. The protective film 30 is equivalent to a resistor, and the initial resistance is R1. The two electrodes may be arranged on the protective film 30 to be electrically connected to power supply circuit 20 The is electrically connected. At this time, the electrical parameter detected by the power supply circuit 20 may be R1. If the temperature of the server motherboard is greater than the predetermined temperature (e.g., 200° C.), the protective film 30 may deform (that is, the shape changes). If the protective film 30 shrinks, the surface that covers the whole PCB shown in FIG. 3 may change to a partial area that covers the PCB shown in FIG. 4. The equivalent resistance of the protective film may change as the shape of the protective film 30 changes. Through the two electrodes connected to the power supply circuit 20, the power supply circuit 20 may detect that the resistance of the protective film 30 may change, e.g., from R1 to R2. The power supply circuit 20 may stop outputting the supply voltage to the substrate 10, e.g., the power supply circuit 20 stops working. When the power supply circuit 20 stops working, no more power supply voltage may be output. The PCB may no longer receive the power supply voltage.

In embodiments of the present disclosure, the protective film 30 may include a special material layer and a conductive layer. The conductive layer may be composed of a conductive grid formed by a plurality of electrical elements. The conductive layer may be embedded in the special material layer. The surface of the electrical elements may be wrapped with the special material that forms the special material layer. The special material layer may include a deformation characteristic. The deformation characteristic may make the shape of the special material layer change when the temperature of the server motherboard is greater than the predetermined temperature. Since the surface of the electrical element is wrapped with the special material that forms the special material layer, when the shape of the special material layer changes as the temperature of the server motherboard is greater than the predetermined temperature. The electrical element may also change to cause the equivalent electrical parameter of the protective film to change.

The electrical element that forms the conductive layer may include but be not limited to, a resistance wire. The conductive grid formed by a plurality of resistance wires may form the conductive layer. When the shape of the special material layer changes as the temperature of the server motherboard is greater than the predetermined temperature, the resistance wire may also change to cause the resistance of the protective film to change. The specific change degree is not limited by embodiments of the present disclosure.

The special material layer and the conductive layer may form the protective film 30 in the following manner. For example, the special material layer may be obtained by cooling, solidifying, and planarizing a special material solution on a release layer for preparing the PCB. The conductive layer formed by the conductive grid composed of the plurality resistance wires may immerse into the special material layer. The processing process corresponding to the special material layer and the conductive layer includes painting the special material solution on the release layer for preparing the PCB to form the special material layer, immersing the conductive layer formed by the conductive grid composed of the plurality of resistance wires into the special material layer, and cooling, solidifying, and planarizing the special material layer and releasing the special material layer from the release layer to obtain the protective film including the special material layer and the conductive layer.

For another example, the special material layer may be obtained by pouring a molten special material solution on the conductive layer on the release layer for preparing the PCB, and performing cooling, solidifying, and planarizing.

The conductive layer may be composed of the conductive grid formed by the plurality of resistance wires. The processing process corresponding to the special material layer and the conductive layer includes arranging the conductive layer composed of the conductive grid formed by the plurality of resistance wires on the release layer for preparing the PCB and pouring the molten special material solution in the conductive grid to form the special material layer that wraps the conductive grid, and cooling, solidifying, and planarizing the special material layer to release the special material layer from the release layer to obtain the protective film including the special material layer and the conductive layer.

In some embodiments, the protective film may include a first special material layer, an isolation layer, and a second special material layer. The isolation layer may be arranged between the first special material layer and the second special material layer. A conductive layer may be coated on the surfaces of the first special material layer and the second special material layer that are close to the isolation layer to prevent the conductive layer coated on the first special material layer from contacting the conductive layer coated on the second special material layer through the isolation layer before the protective film 30 deforms. Thus, the initial electrical parameter may remain unchanged before the protective film 30 deforms.

The first special material layer and the second special material layer may have deformation characteristics. The deformation characteristics may cause the shapes of the first special material layer and the second special material layer to change when the temperature of the server motherboard is greater than the predetermined temperature. When the shapes of the material layer and the second special material layer change, the first special material layer and the second special material layer may press the isolation layer to cause the first special material layer, the second special material layer, and the isolation layer to closely fit. Correspondingly, the conductive layer coated on the first special material layer and the conductive layer coated on the second special material layer may contact with each other to cause the equivalent electrical parameter of the protective film to change.

The server motherboard may detect the equivalent electrical parameter of the protective film in the server motherboard. The equivalent electrical parameter of the protective film may change as the shape of the protective film changes. The shape of the protective film may change when the temperature of the server motherboard is greater than the predetermined temperature. The protective film may cover a partial area of at least one side surface of the PCB of the server motherboard. When the server motherboard detects that the equivalent electrical parameter of the protective film changes, the power supply circuit of the server motherboard may stop to output the power supply voltage to the PCB. Thus, when the temperature of the server motherboard is greater than the predetermined temperature, the power-off protection may be performed on the PCB of the server motherboard. In the case of power-off protection, the modules arranged on the PCB may stop working. Thus, the modules arranged on the PCB may no longer generate heat, which effectively prevents the temperature of the server motherboard from continuing to rise and reduces the possibility that the temperature of the server motherboard accumulates to a temperature that can cause the PCB to burn. Therefore, the possibility of PCB burning may be reduced. The protection of the PCB and the modules arranged on the PCB may be realized. By reducing the possibility of PCB burning, the PCB may be prevented from burning. The possibility of damage to the modules arranged on the PCB due to burning may be reduced to protect the entire area of the PCB.

Corresponding to the server motherboard, embodiments of the present disclosure further provide a server. The server may include a server motherboard and a communication interface. The communication interface may be arranged in the server motherboard. The server motherboard may communicate and interact with another device through the communication interface. The server motherboard may communicate and interact with another server and/or an electronic device through the communication interface.

The server motherboard may include a PCB, a power supply circuit, and a protective film. At least one side surface of the PCB may be covered with the protective film. An equivalent electrical parameter of the protective film may change as the shape of the protective film changes. The shape of the protective film may change when the temperature of the server mainboard is greater than the predetermined temperature. The power supply circuit may be electrically connected to the protective film to detect the equivalent electrical parameter of the protective film. When the equivalent electrical parameter of the protective film changes, the power supply circuit may stop outputting the power supply voltage to the PCB. For the description of the server motherboard, reference may be made to embodiments of the present disclosure, which is not be detailed here.

Figure 5:
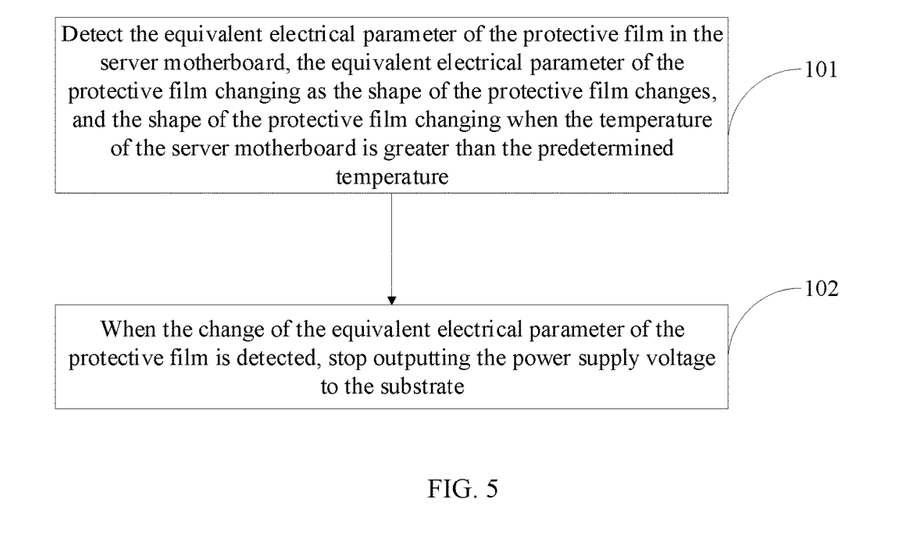
FIG. 5 illustrates a schematic flowchart of a power supply control method according to some other embodiments of the present disclosure.

FIG. 5 illustrates a schematic flowchart of a power supply control method according to some other embodiments of the present disclosure. The power supply control method includes the following processes.

At 101, the equivalent electrical parameter of the protective film in the server motherboard is detected. The equivalent electrical parameter of the protective film changes as the shape of the protective film changes. The shape of the protective film changes when the temperature of the server motherboard is greater than the predetermined temperature. The protective film covers a partial area of at least one side surface of the PCB of the server motherboard.

At 102, when the change of the equivalent electrical parameter of the protective film is detected, the power supply circuit in the server mainboard stops outputting the power supply voltage to the PCB to perform power off protection on the PCB of the server mainboard when the temperature of the server mainboard is greater than the predetermined temperature. In the case of power off protection, the modules arranged on the PCB stop working. Thus, the modules arranged on the PCB no longer generate heat, which effectively prevents the temperature of the server motherboard from continuing to rise, and reduces the possibility that the temperature accumulated on the server motherboard to reach the temperature of causing the PCB burning. Therefore, the possibility of the substrate burning is reduced to protect the PCB and the modules arranged on the PCB. By reducing the possibility of PCB burning to prevent the PCB from burning, the possibility of damage to the modules arranged on the PCB due to burning is reduced. The entire area of the PCB is protected.

For the description of the server motherboard and the protective film, reference may be made to embodiments of the present disclosure, which is not detailed here.

Embodiments of the present disclosure are described in a progressive manner. The features of each embodiment can be combined or replaced with each other. Each embodiment focuses on the differences from other embodiments. For the same or similar parts among embodiments of the present disclosure, reference may be made to each other. For the server and method embodiments, since they are basically similar to server motherboard embodiments, the description is relatively simple. For related parts, reference may be made to the partial description of server motherboard embodiments.

In the present disclosure, relational terms such as first and second are only used to distinguish one entity or operation from another entity or operation, and do not necessarily require or imply any such actual relationship or order between these entities or operations. Moreover, the terms "include," "contain," or any other variants thereof are intended to cover non-exclusive inclusion, so that a process, method, article, or device including a series of elements not only includes those elements, but also includes those that are not explicitly listed, or also includes elements inherent to the process, method, article, or device. If there are no more restrictions, the element defined by the sentence "including a . . . " does not exclude the existence of another same element in the process, method, article, or device that includes the element.

The description of embodiments of the present disclosure enables those skilled in the art to implement or use the present disclosure. Various modifications to embodiments of the present disclosure are obvious to those skilled in the art. The general principles defined herein may be implemented in another embodiment without departing from the spirit or scope of the present disclosure. Therefore, the present disclosure will not be limited to embodiments of the present disclosure, but should conform to the widest scope consistent with the principles and novel features disclosed in the present disclosure.

Some embodiments of the present disclosure are described above. For those of ordinary skill in the art, without departing from the principle of the present disclosure, improvements and modifications may be made, and these improvements and modifications are also within the scope of the present disclosure.

What is claimed is:

1. A server motherboard, comprising:
   a protective film, a shape of the protective film changing in response to a temperature of the server mother board being greater than a predetermined temperature, the protective film being a variable resistance film, and a resistance of the protective film changing as the shape of the protective film changes;
   a substrate, a portion of at least one side surface of the substrate being covered by the protective film; and
   a power supply circuit electrically connected to the protective film and configured to detect the resistance of the protective film, the power supply circuit being further configured to stop outputting a power supply voltage to the substrate in response to detecting a change of the resistance of the protective film, wherein the protective film includes:
   a special material layer having a deformation characteristic, a shape of the special material layer changing in response to the temperature of the server motherboard being greater than the predetermined temperature according to the deformation characteristic; and
   a conductive layer composed of a conductive grid formed by a plurality of electrical devices, the conductive layer being embedded in the special material layer, the plurality of electrical devices being covered with special material for forming the special material layer.

2. The server motherboard of claim 1, wherein:
   the substrate includes a first surface and a second surface opposite to the first surface;
   a flatness measure of the first surface is smaller than a flatness measure of the second surface; and
   the protective film covers the second surface.

3. The server motherboard of claim 2, wherein:
   the power supply circuit is arranged on the first surface;
   in response to arranging a module on the second surface, the protective film is arranged to cover the second surface and a surface formed by the module arranged on the second surface.

4. The server motherboard of claim 1, wherein the conductive layer includes the conductive grid formed by a plurality of resistance wires.

5. The server motherboard of claim 4, wherein:
   the special material layer is obtained by cooling, solidifying, and planarizing a special material solution on a release layer for preparing the substrate; and
   the conductive grid formed by the plurality of resistance wires is immersed into the special material layer.

6. The server motherboard of claim 4, wherein:
   the special material layer is obtained by cooling, solidifying, and planarizing a molten special material solution poured on the conductive layer arranged on the release layer for preparing the substrate; and
   the conductive layer is formed by the conductive grid formed by the plurality of resistance wires.

7. The server motherboard of claim 1, wherein the protective film includes:
   a first special material layer having a deformation characteristic, a shape of the first special material layer changing in response to the temperature of the server motherboard being greater than the predetermined temperature according to the deformation characteristic;
   a second special material layer having a deformation characteristic, a shape of the second special material layer changing in response to the temperature of the server motherboard being greater than the predetermined temperature according to the deformation characteristic; and
   an isolation layer arranged between the first special material layer and the second special material layer, conductive layers being coated on surfaces of the first special material layer and the second special material layer that are close to the isolation layer.

8. A server, comprising:
   a server motherboard including:
   a protective film, a shape of the protective film changing in response to a temperature of the server mother board being greater than a predetermined temperature the protective film being a variable resistance film, and a resistance of the protective film changing as the shape of the protective film changes;
   a substrate, a portion of at least one side surface of the substrate being covered by the protective film; and
   a power supply circuit electrically connected to the protective film and configured to detect the resistance of the protective film, the power supply circuit being further configured to stop outputting a power supply voltage to the substrate in response to detecting a change of the resistance of the protective film, wherein the protective film includes:
   a special material layer having a deformation characteristic, a shape of the special material layer changing in response to the temperature of the server motherboard being greater than the predetermined temperature according to the deformation characteristic; and a conductive layer composed of a conductive grid formed by a plurality of electrical devices, the conductive layer being embedded in the special material layer, the plurality of electrical devices being covered with special material for forming the special material layer; and a communication interface arranged on the server motherboard.

9. The server of claim 8, wherein:

the substrate includes a first surface and a second surface opposite to the first surface;

a flatness measure of the first surface is smaller than a flatness measure of the second surface; and the protective film covers the second surface.

10. The server of claim 9, wherein:

the power supply circuit is arranged on the first surface; and in response to arranging a module on the second surface, the protective film is arranged to cover the second surface and a surface formed by the module arranged on the second surface.

11. The server of claim 8, wherein the conductive layer includes the conductive grid formed by a plurality of resistance wires.

12. The server of claim 11, wherein:

the special material layer is obtained by cooling, solidifying, and planarizing a special material solution on a release layer for preparing the substrate; and the conductive grid formed by the plurality of resistance wires is immersed into the special material layer.

13. The server of claim 11, wherein:

the special material layer is obtained by cooling, solidifying, and planarizing a molten special material solution poured on the conductive layer arranged on the release layer for preparing the substrate; and the conductive layer is formed by the conductive grid formed by the plurality of resistance wires.

14. The server of claim 8, wherein the protective film includes:

a first special material layer having a deformation characteristic, a shape of the first special material layer changing in response to the temperature of the server motherboard being greater than the predetermined temperature according to the deformation characteristic;

a second special material layer having a deformation characteristic, causing a shape of the second special material layer changing in response to the temperature of the server motherboard being greater than the predetermined temperature according to the deformation characteristic; and an isolation layer arranged between the first special material layer and the second special material layer, conductive layers being coated on surfaces of the first special material layer and the second special material layer that are close to the isolation layer.

15. A power supply control method, comprising:

detecting a resistance of a protective film in a server motherboard, the protective film being a variable resistance film, the resistance changing as a shape of the protective film changes, the shape of the protective film changing in response to a temperature of the server motherboard being greater than a predetermined temperature, and the protective film covering a portion of at least one side surface of a substrate of the server motherboard; and in response to detecting a change of the resistance of the protective film, stopping a power supply circuit of the server motherboard from outputting a power supply voltage to the substrate, wherein the protective film includes:

a special material layer having a deformation characteristic, a shape of the special material layer changing in response to the temperature of the server motherboard being greater than the predetermined temperature according to the deformation characteristic;

and a conductive layer composed of a conductive grid formed by a plurality of electrical devices, the conductive layer being embedded in the special material layer, the plurality of electrical devices being covered with special material for forming the special material layer.

16. The power supply control method of claim 15, wherein:

the substrate includes a first surface and a second surface opposite to the first surface;

a flatness measure of the first surface is smaller than a flatness measure of the second surface; and the protective film covers the second surface.

17. The power supply control method of claim 16, wherein:

the power supply circuit is arranged on the first surface;

in response to arranging a module on the second surface, the protective film is arranged to cover the second surface and a surface formed by the module arranged on the second surface.

* * * * *